(12) United States Patent
Hilali

(10) Patent No.: US 10,026,862 B2
(45) Date of Patent: Jul. 17, 2018

(54) INTERDIGITATED BACK CONTACT METAL-INSULATOR-SEMICONDUCTOR SOLAR CELL WITH PRINTED OXIDE TUNNEL JUNCTIONS

(71) Applicant: Zhejiang Kaiying New Materials Co., Ltd., Zhejiang (CN)

(72) Inventor: Mohamed M. Hilali, San Ramon, CA (US)

(73) Assignee: Zhejiang Kaiying New Materials Co., Ltd., Zhejiang (CN)

( * ) Notice: Subject to any disclaimer, the term of this patent is extended or adjusted under 35 U.S.C. 154(b) by 0 days.

(21) Appl. No.: 15/839,585

(22) Filed: Dec. 12, 2017

(65) Prior Publication Data

US 2018/0175229 A1    Jun. 21, 2018

Related U.S. Application Data

(60) Division of application No. 15/663,187, filed on Jul. 28, 2017, which is a continuation of application No. PCT/CN2016/111035, filed on Dec. 20, 2016.

(51) Int. Cl.
| | |
|---|---|
| H01L 31/0352 | (2006.01) |
| H01L 31/068 | (2012.01) |
| H01L 31/0236 | (2006.01) |
| H01L 31/18 | (2006.01) |
| H01L 33/44 | (2010.01) |

(52) U.S. Cl.
CPC .... *H01L 31/0682* (2013.01); *H01L 31/02363* (2013.01); *H01L 31/035272* (2013.01); *H01L 31/18* (2013.01); *H01L 33/44* (2013.01)

(58) Field of Classification Search
CPC ........... H01L 31/0682; H01L 31/02363; H01L 31/035272; H01L 31/18; H01L 33/44
USPC ........................................................ 136/256
See application file for complete search history.

(56) References Cited

U.S. PATENT DOCUMENTS

| | | |
|---|---|---|
| 7,300,606 B2 | 11/2007 | Chung et al. |
| 8,093,491 B2 | 1/2012 | Sridharan et al. |
| 8,952,245 B2 | 2/2015 | Wang et al. |
| 9,209,323 B2 | 12/2015 | Hayashi et al. |
| 9,834,470 B1 | 12/2017 | Hilali et al. |
| 2010/0308462 A1 | 12/2010 | Konno et al. |
| 2011/0120531 A1* | 5/2011 | Nese ................... H01L 31/1804 136/251 |
| 2011/0308597 A1 | 12/2011 | Carroll et al. |

(Continued)

FOREIGN PATENT DOCUMENTS

| | | |
|---|---|---|
| CN | 101948639 | 1/2011 |
| CN | 102290120 | 12/2011 |

(Continued)

OTHER PUBLICATIONS

Kim et al., "Capillary flow of amorphous metal for high performance electrode," Scientific Reports, 2013, vol. 3, No. 2185, 7 pages.

(Continued)

*Primary Examiner* — Jayne L Mershon

(57) ABSTRACT

Screen-printable metallization pastes for forming thin oxide tunnel junctions on the back-side surface of solar cells are disclosed. Interdigitated metal contacts can be deposited on the oxide tunnel junctions to provide all-back metal contact to a solar cell.

20 Claims, 3 Drawing Sheets

(56) References Cited

U.S. PATENT DOCUMENTS

| | | | |
|---|---|---|---|
| 2011/0315217 A1 | 12/2011 | Gee et al. | |
| 2012/0015472 A1 | 1/2012 | Hayashi et al. | |
| 2012/0122272 A1 | 5/2012 | Rana et al. | |
| 2013/0118572 A1* | 5/2013 | Kim | H01L 31/0224 136/256 |
| 2013/0126797 A1 | 5/2013 | Lee et al. | |
| 2013/0255770 A1 | 10/2013 | Carroll et al. | |
| 2013/0341769 A1* | 12/2013 | Koehler | C23C 18/1216 257/632 |
| 2014/0299187 A1 | 10/2014 | Chang et al. | |
| 2014/0338747 A1 | 11/2014 | Choi et al. | |
| 2015/0129030 A1* | 5/2015 | Kapur | H01L 31/02242 136/256 |
| 2015/0144183 A1 | 5/2015 | Yang et al. | |
| 2015/0243607 A1 | 8/2015 | Raskar et al. | |
| 2015/0249167 A1 | 9/2015 | Zhang et al. | |
| 2015/0280024 A1 | 10/2015 | Song et al. | |
| 2015/0333197 A1 | 11/2015 | Takeda et al. | |
| 2015/0364622 A1 | 12/2015 | Jung et al. | |
| 2016/0170192 A1 | 6/2016 | Yamamoto et al. | |
| 2016/0251531 A1 | 9/2016 | Uchida et al. | |
| 2017/0087633 A1 | 3/2017 | Murano et al. | |
| 2017/0306172 A1 | 10/2017 | Koduma et al. | |

FOREIGN PATENT DOCUMENTS

| | | |
|---|---|---|
| CN | 102592708 | 7/2012 |
| CN | 104036842 | 9/2014 |
| CN | 104103699 | 10/2014 |
| CN | 104167454 | 11/2014 |
| CN | 104282357 | 1/2015 |
| CN | 104599741 | 5/2015 |
| CN | 104681648 | 6/2015 |
| CN | 104867535 | 8/2015 |
| CN | 105261669 | 1/2016 |
| CN | 106158068 | 11/2016 |
| CN | 106297956 | 1/2017 |
| KR | 20020060926 | 7/2002 |
| KR | 101377555 | 3/2014 |

OTHER PUBLICATIONS

Non-Final Office Action for U.S. Appl. No. 15/663,296, dated Sep. 14, 2017, 8 pages.
Non-Final Office Action for U.S. Appl. No. 15/663,187, dated Nov. 15, 2017, 6 pages.
International Search Report and Written Opinion for International Application No. PCT/CN2016/095508, dated May 5, 2017, 8 pages.
International Search Report and Written Opinion for International Application No. PCT/CN2016/111036, dated Sep. 1, 2017, 9 pages.
International Search Report and Written Opinion for International Application No. PCT/CN2016/111035, dated Sep. 27, 2017, 8 pages.
BYK-336 Silicone surface additive product data sheet, Sep. 2012, 1 page.
BYK Additives & Instruments Paint Additives, Feb. 2009, 15 pages.
Non-Final Office Action for U.S. Appl. No. 15/849,344, dated Mar. 22, 2018, 12 pages.

* cited by examiner

INTERDIGITATED BACK CONTACT METAL-INSULATOR-SEMICONDUCTOR SOLAR CELL WITH PRINTED OXIDE TUNNEL JUNCTIONS

This application is a divisional of U.S. application Ser. No. 15/663,187, filed on Jul. 28, 2017, which is a continuation of PCT International Application No. PCT/CN2016/111035 filed on Dec. 20, 2016.

FIELD

The invention relates to screen-printable metallization pastes for forming thin oxide tunneling layers on the back-side surface of solar cells. Interdigitated metal contacts can be deposited on the oxide layers to provide all back metal contact to a solar cell.

BACKGROUND

It is desirable to increase the efficiency of silicon solar cells in order to produce more power and reduce the cost of generating solar energy per unit area. One of the most effective ways to improve solar cell efficiency is to situate all electrical contacts on the back surface of the solar cell away from the incident solar radiation. Without a front-side metallization grid the entire top surface area of the solar cell can absorb incident solar radiation. An example of this type of solar cell is the interdigitated back-contact solar cell, which can yield median solar cell efficiencies greater than 23%. However, the process for fabricating interdigitated back-contact solar cells is more complex and expensive compared to conventional solar cell fabrication processes with front-side metallization grid and a back-side aluminum back-surface field.

SUMMARY

According to the invention, a method of interconnecting a silicon substrate, comprises forming a positively charged oxide tunnel junction on a first region of a back surface of a silicon substrate; forming a negatively charged oxide tunnel junction on a second region of a back surface of a silicon substrate; forming a positive electrode on the positively charged oxide tunnel junction; and forming a negative electrode on the negatively charged oxide tunnel junction.

According to the present invention, a solar cell comprises interconnects is fabricated using the method according to the present invention.

According to the present invention, a solar cell comprises a back surface comprising a first region and a second region; a positively-charged silicon oxide layer overlying the first region; a negatively-charged aluminum oxide layer overlying the second region; a positive electrode grid overlying the positively-charged silicon oxide layer; and a negative electrode grid overlying the negatively-charged aluminum oxide layer.

BRIEF DESCRIPTION OF THE DRAWINGS

Those skilled in the art will understand that the drawings described herein are for illustration purposes only. The drawings are not intended to limit the scope of the present disclosure.

DETAILED DESCRIPTION

Figure 1A:
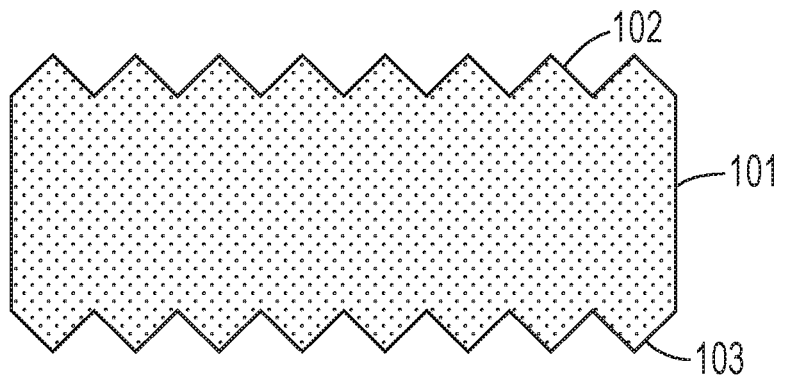
FIG. 1A shows a cross-sectional view of a silicon wafer with textured front and back surfaces.

There is a need to improve the efficiency of silicon solar cells while maintaining the cost per Watt of the photovoltaic module as low as possible. This requires novel processes, material development and techniques to reduce the fabrication cost of the all-back contact solar cells.

All back surface contact solar cells can be fabricated using printed dielectrics on the back-side of the solar cell to act as passivating and insulating tunneling layers for current collection to form a metal-insulator silicon semiconductor (MIS) back-contact solar cell. This fabrication method can eliminate several costly and time-consuming fabrication steps typically used to fabricate all back-contact silicon solar cells. Using the methods disclosed herein, the number of steps and cost of materials used can be similar to that of conventional silicon solar cells.

Metal-insulator-semiconductor (MIS) solar cells can be fabricated using screen printed dielectrics and interdigitated back surface contacts. Screen printed metallization pastes can be used to provide n+- and p+-doped tunneling regions on the back surface of a solar cell. Interdigitated contacts can be formed by screen printing metallization pastes over the tunneling regions. The use of screen printing is consistent with low cost solar cell manufacturing methods.

MIS oxide tunnel junctions for back-side solar cell interconnection such as aluminum oxide thin films are typically deposited by atomic layer deposition. Thin silicon oxide films can be formed by thermal oxidation, wet or steam oxidation, or by plasma-enhanced chemical vapor deposition (PECVD). With these deposition methods masking and etching techniques are used after deposition to pattern the back surface for an all back-contact Si solar cell. Alternatively, using masks during oxide depositions for depositing patterned oxides can be incompatible with high-volume, low-cost manufacturing due to the difficulty in maintaining contamination-free surfaces as well as added overhead cost related to such techniques.

The use of screen printing to form the ultra-thin oxide dielectric layers and the electrodes is compatible with high-volume manufacturing.

Printed back-side MIS solar cells can be fabricated using the following process.

A textured silicon wafer, either N-type or P-type, can be cleaned using a suitable wet-chemical procedure, rinsed and dried. For an N-type Si solar cell using $POCl_3$ or other phosphorous source, phosphorous can be diffused into the top surface of the silicon wafer to provide a front-surface field. The silicon wafer is then deglazed in a hydrofluoric acid solution. After deglazing, an antireflection coating, such as a $SiN_x$ dielectric layer is deposited over the phosphorous-diffused layer on the front-side of the wafer.

Texture on the back-side of the silicon wafer can be removed using a suitable etching solution such as a concentrated alkaline etching solution of sodium hydroxide or potassium hydroxide, to provide a planar back-side surface. The front-side antireflection coating and passivation layer serves as a barrier to etching of the front-side surface.

The silicon wafer can then be cleaned in a hydrochloric acid solution. The native oxide on the back-side surface may be removed using a buffered oxide dip.

A positively charged p+-doped silicon oxide film can be screen printed onto regions of the back-side surface and dried in a reducing or inert atmosphere. In other regions of the back-side surface, a negatively charged n+-doped oxide film can be screen printed and dried. The underlying p- and n-regions of the Si semiconductor can form an interdigitated pattern or any other suitable pattern for the collection of electrons and holes.

The screen printed thin-film oxides can be heated to a temperature sufficient to volatilize and/or to decompose organic components of the dielectric pastes used to form the thin film oxides; to create local tunnel junctions; and to cure the dielectric pastes. For example, the dielectric thin films can be heated to 35° C., to 400° C., or to 450° C. The final thickness of the thin-film oxide can be, for example, less than 100 Å, less than 50 Å, less than 30 Å, less than 20 Å, or less than 10 Å.

After the thin film oxide tunnel junctions have been formed, positive and negative electrodes can be screen-printed onto the p+ and n+ metal oxide tunnel junctions. The positive and negative electrodes can be applied by screen printing in a single step or in more than one step.

The metallization paste can cure at temperatures such as less than 500° C., less than 450° C., or less than 400° C. A metallization paste can comprise an amorphous metal glass to provide for a uniform ohmic contact to the tunnel junctions without etching or damaging the tunnel junctions during the high temperature cure. A metallization paste can comprise, for example, copper particles, copper alloy particles, silver particles, silver alloy particles, or a combination of any of the foregoing.

Examples of steps used in the fabrication of printed interdigitated back metal contact MIS solar cells is shown in FIGS. 1A-1G.

FIG. 1A shows a cross-section of a textured N-type silicon wafer 101 including a top (front-side) textured surface 102 and a bottom (back-side) textured surface 103.

Figure 1B:
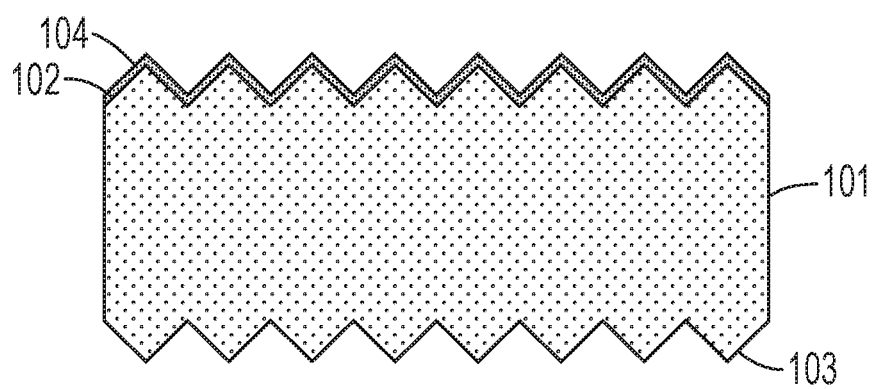
FIG. 1B shows a cross-sectional view of a silicon wafer with a phosphorous diffusion layer on the top textured surface of the silicon wafer.

FIG. 1B shows a cross-section of a textured silicon wafer 101 after phosphorous diffusion on the front-side surface 102 to form an n+-doped layer 104 having a high sheet resistance.

Figure 1C:
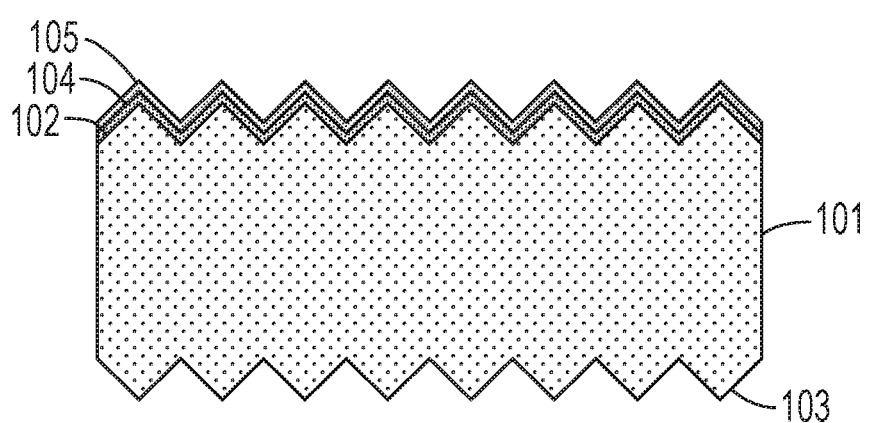
FIG. 1C shows a cross-sectional view of a silicon wafer with an antireflection layer overlying a phosphorous diffusion layer on the top textured surface of the silicon wafer.

FIG. 1C shows a cross-section of a textured silicon wafer 101 after a dielectric antireflection coating 105 such as silicon nitride is applied over the n+ doped surface layer 104.

Figure 1D:
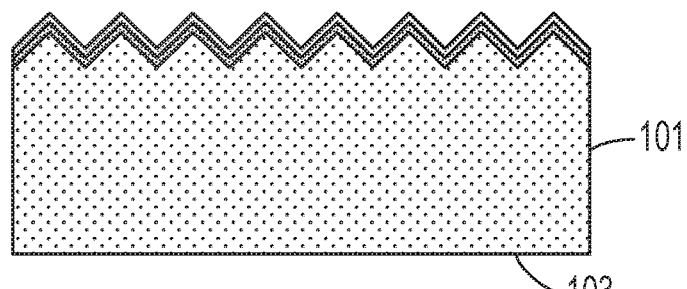
FIG. 1D shows a cross-section view of the silicon wafer of FIG. 1C after planarization of the back-side textured surface.

FIG. 1D shows a cross-section of a silicon wafer 101 after the back-side surface 103 has been planarized.

Figure 1E:
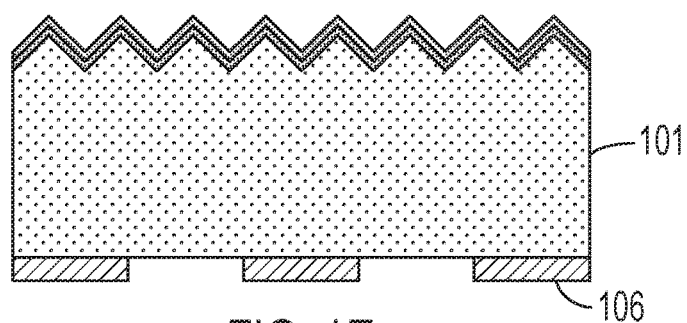
FIG. 1E shows a cross-sectional view of the planarized silicon wafer of FIG. 1D after printing a positively-charred oxide patterned layer on the planarized back surface of the silicon wafer.

FIG. 1E shows a cross-section of a silicon wafer 101 after a positively charged oxide layer 106 has been applied to regions of the back-side by screen printing and curing. The positively charged oxide dielectric layer can comprise a positively charged silicon oxide layer. The cured thickness of the positively charged silicon oxide layer can be, for example, less than 50 Å.

Figure 1F:
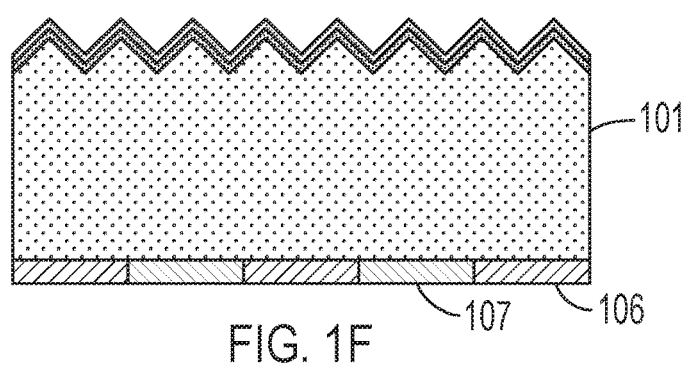
FIG. 1F shows a cross-sectional view of the silicon wafer of FIG. 1E after printing a negatively-charged oxide patterned layer on the planarized back surface of the silicon wafer.

FIG. 1F shows a cross-section of a silicon wafer 101 after a negatively charged oxide layer 107 such as a negatively charged aluminum oxide layer is applied in the back-side regions not covered by the positively charged oxide layer 106. The negatively charged oxide layer can be applied by screen printing.

Figure 1G:
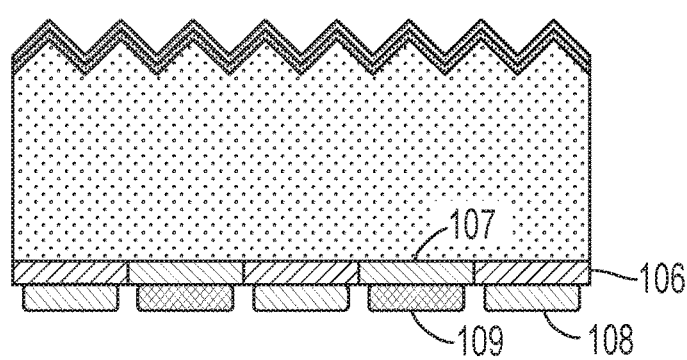
FIG. 1G shows a cross-sectional view of the silicon wafer of FIG. 1F with printed positive and negative electrode grids.

FIG. 1G shows a cross-section of a silicon wafer 101 after interdigitated gridlines 108/109 are applied to the positively and negatively charged oxide tunnel junctions by screen printing. Positive electrodes 108 are electrically interconnected to positively charged oxide tunnel junctions 106 and negative electrodes 109 are electrically interconnected to negatively charged oxide tunnel junctions 107.

Figure 2:
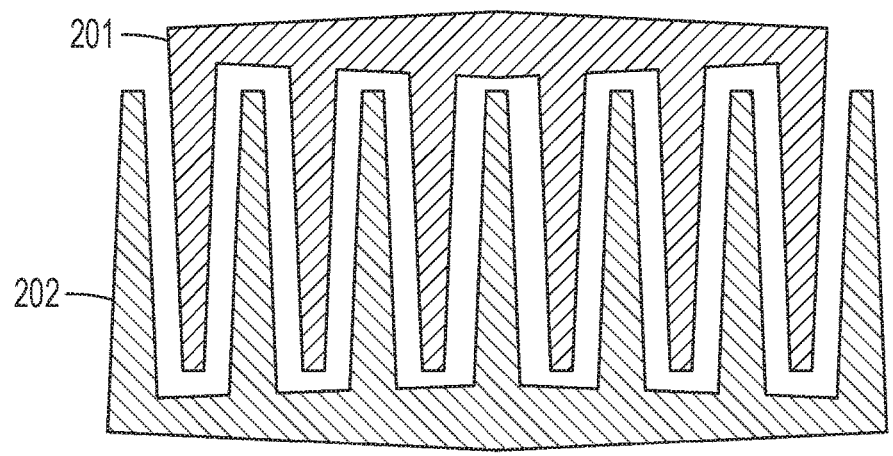
FIG. 2 shows a back surface electrode pattern.

FIG. 2 shows a view of the back-side surface of the silicon wafer showing an example of a configuration for the interdigitated gridlines including positive electrodes 201 and negative electrodes 202.

Figure 3:
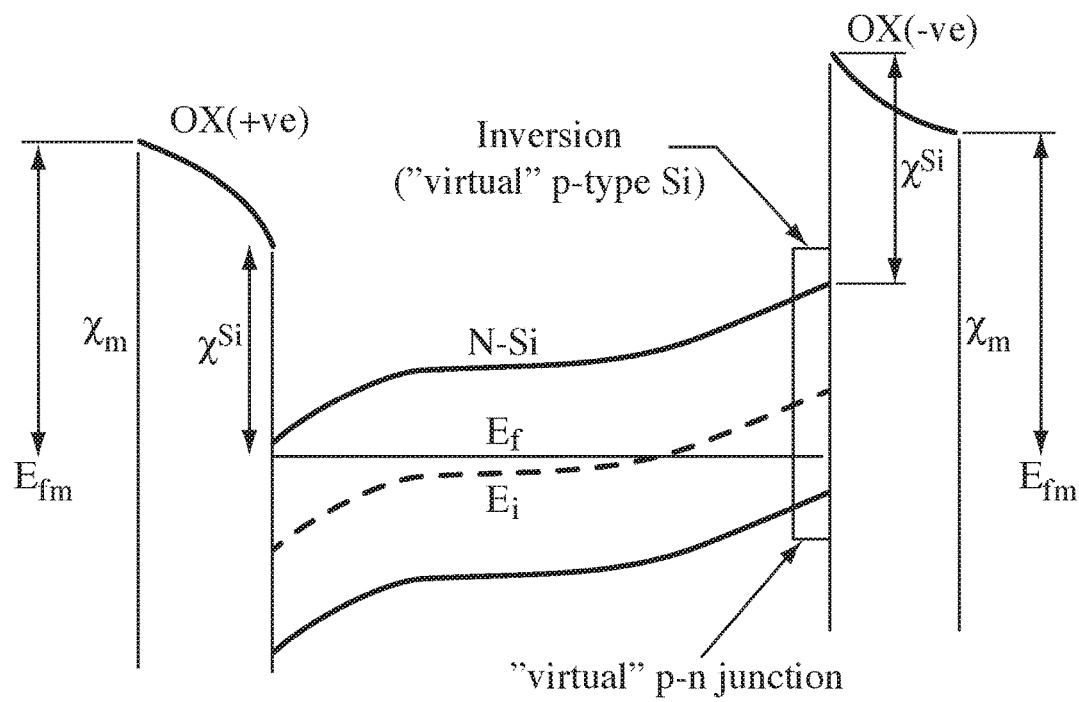
FIG. 3 shows a schematic of an energy band diagram for an all back contact metal-insulator-semiconductor solar cell.

An energy band diagram for the solar cell structure is shown in FIG. 3. From left to right the diagram shows the energy bands for the positively charged oxide layer OX(+ve), the n-type silicon substrate N—Si, the "virtual" p-n junction, and the negatively charged oxide layer OX(-ve).

The gridline metallization paste can uniformly contact the oxide tunnel junction and will not etch through the oxide layers during development.

A gridline metallization paste can comprise an electrically conductive material such as silver, copper, silver alloy, copper alloy, or a combination of any of the foregoing. Silver and copper is intended to include the pure metal and alloys of the metal. For example, a gridline metallization paste can comprise copper, a copper alloy, or a combination thereof.

The electrically conductive particles can comprise, for example, copper and/or copper alloy particles that have been coated with a metallic glass.

The gridline metallization paste can comprise a metallic glass.

Metallic glasses have previously been proposed for use in solar cell electrodes. For example, metallic glass has been proposed for used as frit in thick-film Ag metallization pastes for making electrical contact to bare silicon or silicon oxide surfaces in solar cells. Kim et al., Scientific Reports 3:2185, DOI: 10.1038/srep02185. Conventional Ag metallization pastes incorporating oxide glasses can flow and dissolve the silicon oxide tunnel junction and the underlying silicon to a depth of 1,000 A or more. Also, traditional metal oxide glass frit technology has only been shown to work with Ag as the functional phase powder material.

On the other hand, metallic glass will not etch through typical dielectric layers such as silicon nitride layers used in solar cells and will not flow at temperatures in solar cell manufacturing. At solar cell manufacturing temperatures, metallic glass will crystalize thereby improving the electrical conductivity. Thus, metallic glass electrodes will not damage the oxide and oxide-silicon interface and will not compromise the surface recombination velocity of the solar cell.

The metallic glass can also act as a barrier to copper diffusion into silicon, thereby enhancing the reliability of the solar cell.

During annealing of the solar cell, a metallic glass can be heated to a temperature that is higher than the glass transition temperature of the metallic glass such that during cooling the metallic glass can at least partly crystallize, which can increase the mechanical stability of the metallic glass and lead to increased conductivity.

A metallic glass can comprise at least two elements. For example, a first element of the at least two elements can have a high electrical conductivity and can have a higher crystallization temperature than the other elements forming the metallic glass.

A metallic glass can comprise, for example, silver (Ag), copper (Cu), gold (Au), aluminum (Al), calcium (Ca), beryllium (Be), magnesium (Mg), sodium (Na), molybdenum (Mo), tungsten (W), tin (Sn), zinc (Zn), nickel (Ni), potassium (K), lithium (Li), iron (Fe), palladium (Pd), platinum (Pt), rubidium (Rb), chromium (Cr), strontium (Sr), zirconium (Zr), cobalt (Co), hafnium (Hf), titanium (Ti), manganese (Mn), iron (Fe), phosphorus (P), ruthenium (Ru), yttrium (Y), lanthanum (La), niobium (Nb), neodymium (Nd), vanadium (V), boron (B), silicon (Si), osmium (Os), gallium (Ga), or a combination of any of the foregoing.

Examples of suitable metallic glass alloys include ZrCuNiAl, CuZr, CuZrAl, CuZrAg, CuZrAlAg, CuZrAlAgNi, CuZrAlNi, ZrTiNbCuNiAl, MgZn, MgCu, MgNi, MgNiY, MgCa, AlNiYLa, AlMg, AlMgCa, TiZrCuNi, NiNbZrTiPt, AlNiLa, ZrCuTiNiBe, MgCuYAg, AlLiCu, AlYFe, AgMgCa, and AgMgCaCu, A metallic glass can comprise copper, zirconium, aluminum, silver, nickel, or a combination of any of the foregoing.

Metallic glasses can be formed by heating a combination of elements to form a metal liquid and rapidly quenching the liquid.

A metallic glass can include an alloy having a disordered atomic structure comprising two or more elements. A metallic glass may be a metallic glass or may be at least partly crystallized. A metallic glass may have from 50 wt % to about 99.9 wt %, such as from 60 wt % to 99 wt %, or from 70 wt % to 95 wt % amorphous content, based on a total weight of the metallic glass. A metallic glass may comprise from 1 wt % to 50 wt %, such as from 2 wt % to 40 wt %, or from 4 wt % to 30 wt % crystalline content, based on a total weight of the metallic glass.

A metallic glass can be characterized by a low resistance. For example, a metallic glass may have a resistivity within a range from 2 µΩ-cm to 1000 µΩ-cm, such as within a range from 5 µΩ-cm to 800 µΩ-cm, or from 10 µΩ-cm to 600 µΩ-cm. The resistivity of the metallic glass can decrease when the metallic glass is heat treated at a temperature that is higher than a glass transition temperature of the metallic glass. The temperature that is higher than a glass transition temperature of the metallic glass may be within a range from 1° C. to 300° C., such as within a range from 5° C. to 250° C., or within a range from 10° C. to 200° C. higher than the glass transition Tg of the metallic glass.

For example, when heat-treated at a temperature within a range from 400° C. to 800° C., such as within a range from 500° C. to 700° C., the resistivity of the metallic glass may decrease by 1 µΩ-cm to 200 µΩ-cm, such as by 5 µΩ-cm to 150 µΩ-cm, by 10 µΩ-cm to 100 µΩ-cm, or by 20 µΩ-cm to 75 µΩ-cm. In comparison, metal oxide glass metallization pastes comprising Ag particles, can have a high resistivity greater than about $10^{13}$ Ω-cm, which after sintering of the Ag particles can be reduced to $10^7$ Ω-cm to $10^9$ Ω-cm. Amorphous and crystallized metallic glass can have a much lower resistivity than conventional glasses in typical metallization pastes.

Because the metallic glass has a low resistivity it may be considered to be an electrical conductor at a voltage and at a current of a solar cell.

A metallic glass may be characterized by a glass transition temperature, Tg, for example, greater than 100° C., greater than 150° C., or greater than 200° C. A metallic glass can be characterized by a glass transition temperature within the range from 100° C. to 700° C., such as within the range from 150° C. to 650° C., or within the range from 200° C. to about 600° C. A metallic glass can be characterized by a crystallization temperature Tc within a range from 120° C. to 720° C., such as within the range from 170° C. to 670° C., or within the range from 220° C. to 620° C.

A metallic glass alloy can be selected to exhibit a suitable crystallization temperature. For example, a suitable metallic glass alloy can have a crystallization temperature less than that of the firing temperature used to develop the metallization paste used to form the electrical conductors. A firing temperature can, for example, be less than 600° C., less than 500° C., less than 450° C., or less than 400° C.

A metallic glass alloy can be selected to exhibit a suitable adhesion to silicon oxide and/or to a metal forming a wire core. For example, a metallic glass alloy can be selected to have a pull strength on a solar cell surface from 1 N/mm to 7 N/mm, as determined according to a 180° pull test with a 50 mm/min stretch rate.

A metallic glass alloy can be selected to have a suitable electrical resistivity such as from 50 µΩ-cm to 20,000 µΩ-cm.

The positive and negative electrodes of an all-back contact solar cell can be fabricated using metallization pastes comprising metallic glass-coated particles.

Solar cell thick film metallization pastes typically contain Ag particles. Because of the much lower costs, it is desirable to use copper as the conductive metal. However, thick film metallization pastes using glass frit to etch through thick oxide layers has only been demonstrated to work effectively with Ag, in part due to the propensity for copper to diffuse into the silicon. Copper will also tend to oxidize during firing, which significantly reduces the sintered copper line conductivity.

Because the tunnel junctions are exposed, it is possible to employ metallization pastes that do not comprise glass frit to form the positive and negative electrodes.

Aspects of the invention include thick film metallization pastes comprising metallic glass-coated particles. The metallic glass-coated particles can comprise a core of a conductive metal or metal alloy surrounded by a coating of a metallic glass. The electrically conductive core material can be, for example, silver, a silver alloy, copper, or a copper alloy. Metallization pastes comprising metal-coated copper alloy particles have been proposed, for example see U.S. Application Publication No. 2011/0315217, which discloses copper particles coated with one or more layers of metal.

Aspects of the present invention also include silver particles having a coating of a metallic glass. As used herein, silver refers to pure silver and silver alloys. Metallic glass-coated silver particles can have the same or similar properties, dimensions, and compositions as for metallic glass-coated copper particles. Metallic glass-coated silver particles may be used in the same way as metallic glass-coated copper particles to form a metallization paste.

A metallization paste and resulting solar cell electrode may include metallic glass-coated copper particles, metallic glass-coated silver particles, or a combination thereof. The particles used in a metallization paste may have a coating of the same or similar metallic glass or may have coatings of different metallic glasses. For example, for copper particles, it may be useful that the metallic glass coating be selected to prevent or minimize copper diffusion. The metallic glass coating the particles can include any of the metallic glasses referred to herein for coating a wire conductor.

Metallic glass-coated particles can be incorporated into a suitable metallization paste, which can include various components for formulating the desired properties of the paste. Upon sintering the metallic glass coating can at least partly crystallize to increase the conductivity of the metallic glass coating and help sinter adjacent particles to enhance the conductivity of the electrode. The metallic glass coating can provide a copper and/or silver diffusion barrier and can prevent or substantially reduce corrosion of the copper and/or silver particle.

A metallization paste may comprise metal particles and metallic glass-coated particles; metal particles and metallic glass; or metallic glass-coated particles and metallic glass. For example, a metallization paste may comprise silver and/or copper particles, and metallic glass-coated silver and/or copper particles; silver and/or copper particles and metallic glass; or metallic glass-coated silver and/or metal particles and metallic glass.

The metallic glass-coated particles can be characterized by an average particle diameter, for example, from 1 nm to 1000 nm, from 1 nm to 600 nm, from 1 nm to 400 nm, from 20 nm to 400 nm, or from 50 nm to 200 nm. The metallic glass-coated particles can be characterized average particle diameter D50 from 1 μm to 200 μm, from 1 μm to 150 μm, from 1 μm to 100 μm, from 1 μm to 50 μm, from 1 μm to 30 μm, or from 1 μm to 20 μm.

A metallization paste may also include other metal particles in addition to the metallic glass-coated particles. The additional metals can be used to adjust the rheology, bonding, adhesion, fusion during firing or sintering, and/or electrical conductivity. For example, the additional particles can include Ag particles. A metallization paste may comprise copper and/or silver particles coated with different metallic glasses. The different metallic glass may be selected, for example, based on electrical conductivity, melt temperature, or crystallization temperature. For example, a certain metallic glass may have a lower melt temperature, which could enhance binding, but also exhibit a lower conductivity. Particles with this metallic glass coating could be combined, for example, with copper particles having a high electrical conductivity.

In certain embodiments, a metallization paste may comprise silver particles, without frit and without metallic glass. Electrically conductive silver pastes capable of curing at low temperature are known in the art. Any suitable metallization paste comprising silver particles used to form solar cell electrodes may be used.

Conductive particles such as copper and/or silver particles can be coated with a metallic glass. The particles can be combined with other additives, modifiers, and organic medium to form a metallization paste similar to a Ag metallization paste The metallization paste containing metallic glass-coated particles can then be applied or printed on a surface of a solar cell having openings exposing localized BSF regions (back-side) or emitter regions (front-side). As with the metallic glass-coated wires, the metallic glass will not damage the tunnel junctions and upon annealing can form highly conductive electrodes.

A metallization paste may further include additives to modify the physical properties of the paste such as to enhance flow, process properties, and stability. Additives may include, for example, dispersants, thixotropic agents, plasticizers, viscosity stabilizers, anti-foaming agents, surfactants, pigments, UV stabilizers, antioxidants, coupling agents, and combinations of any of the foregoing.

A metallization paste provided by the present disclosure can comprise, for example, from 0.01 wt % to 5 wt % of an organic resin; from 1 wt % to 45 wt % of a solvent; and from 0.01 wt % to 5 wt % of one or more additives, where wt % is based on the total weight of the composition.

A composition can comprise an organic binder or combination of organic binders.

An organic binder, also referred to as an organic resin, can be used to impart a desired viscosity and/or rheological property to a metallization paste to facilitate screen printing solar cell electrodes. The organic binder can also facilitate homogeneous dispersion of the inorganic component within the printable composition.

Suitable organic binders include, for example, acrylate resins and cellulose resins such as ethylcellulose, ethyl hydroxyethylcellulose, nitrocellulose, blends of ethylcellulose and phenol resins, alkyd resins, phenol resins, acrylate esters, xylenes, polybutanes, polyesters, ureas, melamines, vinyl acetate resins, wood rosin, polymethacrylates of alcohols, and combinations of any of the foregoing.

Other suitable resins include, for example, ethyl cellulose, cellulose ester (CAB, CAP), polyacrylate, polysiloxane (modified), polyvinyl butyral (PVB), polyvinyl pyrrolidone (PVP), saturated polyester, non-reactive polyamide (PA), modified polyether, and combinations of any of the foregoing. Other resins characterized by medium polarity may also be used. A resin can comprise ethyl cellulose.

An organic binder may be present in an amount from 0.1 wt % to 10 wt %, from 0.1 wt % to 6 wt %, from 0.2 wt % to 4 wt %, from 0.2 wt % to 2 wt %, or from 0.2 wt % to 1 wt %, where wt % is based on the total weight of the printable composition.

A composition can comprise an organic solvent or combination of organic solvents.

An organic solvent can be used to impart solubility, dispersion, and coupling to the metallization paste.

Examples of suitable solvents include terpineol, glycol ether, glycol ether acetate, Texanol™ (ester alcohol), tributyl citrate, tributyl O-acetylcitrate, DBE® esters (mixture of dimethyl adipate, dimethyl glutarate and dimethyl succinate); dimethyl phthalate (DMP), and combinations of any of the foregoing. A suitable solvent can have, for example, a boiling point greater than 200° C. and an evaporation rate less than 0.01 at room temperature. A suitable solvent can be an oxygenated solvent including alcohols such as ethanol, methanol, butanol, n-propyl alcohol, isobutyl alcohol, and isopropyl alcohols; esters such as ethyl acetate, n-butyl acetate, n-propyl acetate, and isopropyl acetate; and ketones such as acetone, diacetone alcohol, isophorone, cyclohexanone, methyl ethyl ketone, and methyl isobutyl ketone. Other suitable ethers, alcohols, and/or esters may also be used.

In certain embodiments, a solvent comprises a glycol ether.

Other examples of suitable solvents include hexane, toluene, ethyl Cellusolve™, cyclohexanone, butyl Cellusolve™, butyl carbitol (diethylene glycol monobutyl ether), dibutyl carbitol (diethylene glycol dibutyl ether), butyl carbitol acetate (diethylene glycol monobutyl ether acetate), propylene glycol monomethyl ether, hexylene glycol, terpineol, methylethylketone, benzyl alcohol, γ-butyrolactone, ethyl lactate, and combinations of any of the foregoing.

A printable composition can include from 1 wt % to 15 wt %, from 2 wt % to 10 wt %, from 3 wt % to 9 wt %, or from 5 wt % to 8 wt % of an organic solvent, where wt % is based on the total weight of the printable composition.

An additive or combination of additives may be present in the composition in an amount, for example, from 0.1 wt % to about 5 wt %, from 0.1 wt % to 1.5 wt %, from 0.5 wt % to 1.5 wt % or from, 0.3 wt % to 1 wt %, where wt % is based on the total weight of the composition.

For screen printing fine lines with a high aspect ratio it is desirable that a front-side metallization paste provided by the present disclosure exhibit a viscosity, for example, of 500 Poise to 7000 Poise at a temperature from 15° C. to 50° C., as determined using a viscometer with a 10 rpm spindle rotation rate.

It can also be desirable that a metallization paste exhibit a glass transition temperature $T_g$ from 200° C. to 800° C. as determined using differential scanning calorimetry (DSC).

A metallization paste can be prepared using the following procedure.

An organic vehicle can be prepared by mixing and heating a solvent or mixture of solvents and organic resin or organic resins, plasticizer, defoaming agent, and additives such as rheological thixotropic additive.

Metallic glass-coated particles can be combined with the organic vehicle, organic vehicle and other additives and thoroughly mixed.

The metallization paste can then be milled to achieve a desired dispersion of the inorganic components. The metallization paste can then be filtered to remove any undesired large particulates.

The metallization paste can be applied to a surface of a silicon solar cell by screen printing. The screen used in solar cell screen printing can be a mesh covered by an emulsion which is patterned to form the grid pattern. The mesh number can be, for example, from 300 mesh to 400 mesh, such as from 325 mesh to 380 mesh and the mesh wire, which can be stainless steel, can have a diameter from about 0.3 mils to 1.5 mils, such as a diameter from 0.5 mils to 1.1 mils. Other screens and mesh sizes can be used as appropriate for a particular metallization paste, process conditions, and desired feature sizes.

The deposited metallization paste in the form of electrical conductors such as grid lines can have, for example, a width from 0.5 mils to 4 mils, and a height from 0.1 mils to 1.5 mils.

After being applied to a Si substrate, the screen-printed composition can be dried, for example, at a temperature within a range from 200° C. to 400° C. for from 10 seconds to 60 seconds, and then baked and fired at a temperature within a range from 300° C. to 500° C. For example peak temperature can range from 400° C. to 500° C., and the time of exposure to heating can range from 30 seconds to 50 seconds, to provide front-side electrical conductors. Other temperatures, times, and temperature profiles may be used. In general, it can be desirable the temperature be less than 500° C.

Solar cell busbars having dimensions of 1.2 mm width and 16 μm height can exhibit and electrical resistivity of 1.9 μΩ-cm and can exhibit an adhesion strength of at least 2 N on a Si substrate, where the electrical conductivity is determined according to line resistivity electrical probe measurement and the adhesion strength is determined according to a 180° solder tab pull test. For context, Ag thick-film busbars having a resistivity less than 2μΩ-cm and an adhesion strength greater than 1.5 N are generally considered acceptable for use in the solar cell industry.

Solar cell conductive electrodes prepared from metallic glass-coated particles provided by the present disclosure maintain acceptable conductivity and adhesion strength following exposure to accelerated environmental test conditions including damp-heat testing and accelerated thermal cycling, which are used to qualify solar cells for a 25-year service life.

According to an aspect of the invention, a method of interconnecting a silicon substrate, comprises forming a positively charged oxide tunnel junction on a first region of a back surface of a silicon substrate; forming a negatively charged oxide tunnel junction on a second region of a back surface of a silicon substrate; forming a positive electrode on the positively charged oxide tunnel junction; and forming a negative electrode on the negatively charged oxide tunnel junction.

According to any of the preceding aspects, the method comprises, before forming the charged oxide tunnel junctions, forming a doped layer on a front surface of a silicon wafer, wherein the silicon wafer comprises a silicon substrate comprising a front surface and a back surface opposite to the front surface; depositing an antireflection layer on the doped layer on the front surface; and planarizing the back surface.

According to any of the preceding aspects, forming the positive electrode and forming the negative electrode comprises screen printing a metallization paste on the positively charged oxide tunnel junction and on the negatively charged oxide tunnel junction.

According to any of the preceding aspects, the metallization paste comprises: copper particles and metallic glass; copper particles and metallic glass-coated copper particles; or metallic glass-coated copper particles.

According to any of the preceding aspects, the metallization paste comprises: silver particles and metallic glass; silver particles and metallic glass-coated silver particles; or metallic glass-coated silver particles.

According to any of the preceding aspects, the positively changed oxide tunnel junction and the negatively charged oxide tunnel junction form an interdigitated pattern.

According to any of the preceding aspects, the positive electrode and the negative electrode form an interdigitated pattern.

According to any of the preceding aspects, forming the positively charged oxide tunnel junctions comprises screen printing a positively charged dielectric paste.

According to any of the preceding aspects, the positively charged dielectric paste comprises silicon oxide.

According to any of the preceding aspects, the cured positively charged oxide tunnel junction is characterized by a thickness less than 50 Å.

According to any of the preceding aspects, forming the negatively charged oxide tunnel junctions comprises screen printing a negatively charged dielectric paste.

According to any of the preceding aspects, the negatively charged dielectric paste comprises aluminum oxide.

According to any of the preceding aspects, the cured negatively charged oxide tunnel junction is characterized by a thickness less than 50 Å.

According to any of the preceding aspects, forming the positively charged oxide tunnel junction and forming the negatively charged oxide tunnel junction comprises simultaneously forming the positively charged oxide tunnel junction and forming the negatively charged oxide tunnel junction.

In an aspect according to the present invention, a solar cell comprises interconnects is fabricated using the method according to the present invention.

In an aspect of the present invention, a solar cell comprises a back surface comprising a first region and a second region; a positively-charged silicon oxide layer overlying the first region; a negatively-charged aluminum oxide layer overlying the second region; a positive electrode grid overlying the positively-charged silicon oxide layer; and a negative electrode grid overlying the negatively-charged aluminum oxide layer.

According to any of the preceding aspects, the positively-charged silicon oxide layer and the negatively-charged aluminum oxide layer are interdigitated; and wherein the positive electrode grid and the negative electrode grid are interdigitated.

According to any of the preceding aspects, each of the positively-charged silicon oxide layer and the negatively-charged aluminum oxide layer are characterized by a thickness from 1 Å to 45 Å.

According to any of the preceding aspects, each of the positive electrode grid and the negative electrode grid comprise copper particles, copper alloy particles, silver particles, silver alloy particles, or a combination of any of the foregoing. According to any of the preceding aspects, each of the positive electrode grid and the negative electrode grid comprise amorphous metal glass.

It should be noted that there are alternative ways of implementing the embodiments disclosed herein. Accordingly, the present embodiments are to be considered as illustrative and not restrictive. Furthermore, the claims are not to be limited to the details given herein, and are entitled their full scope and equivalents thereof.

What is claimed is:

1. A method of interconnecting a semiconductor device, comprising:
    screen printing a positively charged dielectric paste on a first region of a back surface of a silicon substrate, wherein the positively charged dielectric paste comprises a positively charged silicon oxide;
    screen printing a negatively charged dielectric paste on a second region of the back surface of the silicon substrate, wherein the negatively charged dielectric paste comprises a negatively charged aluminum oxide;
    curing the positively charged dielectric paste and the negatively charged dielectric paste under conditions sufficient to form positively charged oxide tunnel junctions and negatively charged oxide tunnel junctions;
    screen printing a first gridline metallization paste on the positively charged oxide tunnel junctions;
    screen printing a second gridline metallization paste on the negatively charged oxide tunnel junctions; and
    firing the first gridline metallization paste and the second gridline metallization paste to form a positive electrode and a negative electrode,
    wherein each of the first gridline metallization paste and the second gridline metallization paste comprises:
        a metal selected from copper, silver, or a combination thereof; and
        a metallic glass, a non-oxide glass, or a combination thereof.

2. The method of claim 1, further comprising, before screen printing the positively charged dielectric paste:
    forming a doped layer on a front surface of the silicon substrate;
    depositing an antireflection layer on the doped layer; and
    planarizing the back surface.

3. The method of claim 1 wherein the positively charged dielectric paste comprises silicon dioxide.

4. The method of claim 1 wherein the negatively charged dielectric paste comprises aluminum dioxide.

5. The method of claim 1, wherein the positively charged oxide tunnel junctions and the negatively charged oxide tunnel junctions form an interdigitated pattern.

6. The method of claim 1, wherein the positively charged oxide tunnel junctions and the negatively charged oxide tunnel junctions are characterized by a thickness less than 50 Å.

7. The method of claim 1, wherein, the first gridline metallization paste and the second gridline metallization paste comprise the same composition.

8. The method of claim 1, wherein curing comprises simultaneously firing the first gridline metallization paste and the second gridline metallization paste.

9. The method of claim 1, wherein both the first gridline metallization paste and the second gridline metallization paste comprise metallic glass-coated copper particles, non-oxide glass-coated copper particles, metallic glass-coated silver particles, non-oxide glass-coated silver particles, or a combination of any of the foregoing.

10. The method of claim 1, wherein the positive electrode and the negative electrode form an interdigitated pattern.

11. The method of claim 1, wherein the semiconductor device comprises a solar cell.

12. A method of forming an electrode on a semiconductor device, comprising:
    screen printing a positively-charged silicon oxide layer on a first region of a silicon substrate and forming a positively charged oxide tunnel junction on the first region of the silicon substrate, wherein the positively-charged silicon oxide layer comprises a doped silicon oxide;
    screen printing a negatively-charged aluminum oxide layer on a second region of the semiconductor device and forming a negatively charged oxide tunnel junction on the second region the silicon substrate, wherein the negatively-charged silicon oxide layer comprises a doped aluminum oxide;
    forming a positive electrode on the positively charged oxide tunnel junction; and
    forming a negative electrode on the negatively charged oxide tunnel junction.

13. The method of claim 12, wherein,
    forming the positively charged oxide tunnel junction comprises curing the positively charged oxide layer; and
    forming the negatively charged oxide tunnel junction comprises curing the negatively charged oxide layer;
    wherein curing comprises exposing the positively charged oxide layer and the negatively charged oxide layer to conditions sufficient to form at least one tunnel junction.

14. The method of claim 12, wherein,
    forming the positive electrode comprises:
        depositing by screen printing a first gridline metallization paste; and
        curing the deposited first gridline metallization paste; and
    forming the negative electrode comprises:
        depositing by screen printing a second gridline metallization paste; and
        curing the deposited second gridline metallization paste.

15. The method of claim 14, wherein the first gridline metallization paste and the second gridline metallization paste comprise a metallic glass, a non-oxide glass, or a combination thereof.

16. The method of claim 15, wherein curing the deposited first gridline metallization paste and the deposited second gridline metallization paste comprises at least partially crystallizing the metallic glass, at least partially crystallizing the non-oxide glass, or at least partially crystallizing both the metallic glass and the non-oxide glass.

17. The method of claim 14, wherein the first gridline metallization paste and the second metallization paste comprise the same composition.

18. The method of claim 14, wherein curing the deposited first gridline metallization paste and the deposited second gridline metallization paste comprises simultaneously firing the deposited first gridline metallization paste and the deposited second metallization paste.

19. The method of claim 12, wherein the semiconductor device comprises a solar cell.

20. The method of claim 12, wherein the first gridline metallization paste and the second gridline metallization paste comprise metallic glass-coated copper particles, non-oxide glass-coated copper particles, metallic glass-coated silver particles, non-oxide glass-coated silver particles, or a combination of any of the foregoing.

* * * * *